(12) United States Patent
Imada

(10) Patent No.: US 9,688,896 B2
(45) Date of Patent: Jun. 27, 2017

(54) THERMALLY CONDUCTIVE RESIN COMPOSITION AND THERMALLY CONDUCTIVE SHEET INCLUDING THE SAME

(71) Applicant: NIPPON VALQUA INDUSTRIES, LTD., Tokyo (JP)

(72) Inventor: Hirohisa Imada, Gojo (JP)

(73) Assignee: NIPPON VALQUA INDUSTRIES, LTD., Tokyo (JP)

( * ) Notice: Subject to any disclaimer, the term of this patent is extended or adjusted under 35 U.S.C. 154(b) by 255 days.

(21) Appl. No.: 14/501,540

(22) Filed: Sep. 30, 2014

(65) Prior Publication Data

US 2015/0014578 A1      Jan. 15, 2015

Related U.S. Application Data

(62) Division of application No. 13/826,255, filed on Mar. 14, 2013, now Pat. No. 8,912,278.

(30) Foreign Application Priority Data

Mar. 19, 2012   (JP) ................................ 2012-061767

(51) Int. Cl.
| | |
|---|---|
| *C08G 77/06* | (2006.01) |
| *C08K 5/541* | (2006.01) |
| *C09K 5/14* | (2006.01) |
| *C09K 5/00* | (2006.01) |
| *H05K 7/20* | (2006.01) |

(52) U.S. Cl.
CPC .................. *C09K 5/14* (2013.01); *C09K 5/00* (2013.01); *H05K 7/20436* (2013.01); *H01L 2924/0002* (2013.01)

(58) Field of Classification Search
USPC ................................................ 524/588, 261
See application file for complete search history.

(56) References Cited

U.S. PATENT DOCUMENTS

| | | | | |
|---|---|---|---|---|
| 8,912,278 B2 * | 12/2014 | Imada | ...................... | C09K 5/00 524/261 |
| 2003/0160207 A1 * | 8/2003 | Sakaguchi | ........... | C08K 5/5419 252/71 |
| 2005/0277731 A1 * | 12/2005 | Fukuda | ................ | C08K 5/5406 524/588 |
| 2008/0153986 A1 | 6/2008 | Maeda et al. | | |
| 2009/0292096 A1 * | 11/2009 | Fukuda | ................ | C08K 5/5406 528/31 |
| 2011/0024675 A1 | 2/2011 | Endo et al. | | |

FOREIGN PATENT DOCUMENTS

| | | | |
|---|---|---|---|
| JP | 2003-292761 | | 10/2003 |
| JP | 2003-313440 | | 11/2003 |
| JP | 2003-313440 A | * | 11/2003 |
| JP | 2005-97369 | | 4/2005 |
| JP | 2005-097369 A | * | 4/2005 |
| JP | 2006-22319 | | 1/2006 |
| JP | 2006-022319 A | * | 1/2006 |
| JP | 2010-232535 | | 10/2010 |
| JP | 2010-232535 A | * | 10/2010 |
| KR | 10-2005-0017402 | | 2/2005 |
| KR | 10-2007-0089863 | | 9/2007 |
| KR | 10-2010-0126338 | | 12/2010 |

OTHER PUBLICATIONS

Office Action dated Dec. 17, 2013, from the Japanese Patent Office in corresponding JP Application No. 2012-061767, and English translation thereof.
Notice of Allowance dated Nov. 19, 2014, from the Korean Patent Office in corresponding KR Application No. 2013-0027302, and English translation thereof.

* cited by examiner

*Primary Examiner* — Mark Kaucher
*Assistant Examiner* — Henry Hu
(74) *Attorney, Agent, or Firm* — Westerman, Hattori, Daniels & Adrian, LLP

(57) ABSTRACT

A thermally conductive resin composition containing (A1) a fluorine-based compound having one to two terminal SiH group(s), in which a content of molecules having two such groups is 60 to 100 mole %, (B1) a fluorine-based compound having one to two terminal alkenyl group(s), in which a content of molecules having two such groups is 60 to 100 mole %, (A2) a fluorine-based compound in which a content of molecules having two terminal SiH groups is 0 to 40 mole %, (B2) a fluorine-based compound in which a content of molecules having two terminal alkenyl groups is 0 to 40 mole %, and (C) a thermally conductive filler, and satisfying, in connection with the content of the fluorine-based compounds, relation of [(A1)+(B1)]/[(A2)+(B2)]=20/80 to 80/20, (A1)/(B1)=20/80 to 80/20, and (A2)/(B2)=20/80 to 80/20, as well as a thermally conductive sheet including the same are provided.

6 Claims, No Drawings

THERMALLY CONDUCTIVE RESIN COMPOSITION AND THERMALLY CONDUCTIVE SHEET INCLUDING THE SAME

BACKGROUND OF THE INVENTION

Field of the Invention

The present invention relates to a thermally conductive sheet used as a sheet or the like interposed between a heat generator and a heat radiator for efficiently conducting heat from the heat generator to the heat radiator, and to a thermally conductive resin composition for forming the same.

Description of the Background Art

A thermally conductive sheet has conventionally been arranged between a heat generator such as electronic components and a heat radiator (a heat radiating member or a cooling member), as means for efficiently dissipating heat generated in various apparatuses or electronic devices to the outside. By interposing a thermally conductive sheet having flexibility and high heat conduction performance, a heat generator and a heat radiator can be coupled to each other with good adhesive force, with the thermally conductive sheet high in heat conduction performance being interposed. Therefore, consequently, as compared with a case where a thermally conductive sheet is not interposed, efficiency in heat conduction from a heat generator to a heat radiator can be improved.

Many of thermally conductive sheets currently commercially available in general are silicone rubber sheets mainly composed of silicon. It has been well known, however, that the thermally conductive sheet made of silicone rubber gives rise to a problem of pollution of a system due to volatilization of a low-molecular-weight siloxane component contained in the sheet. In addition, recently, in particular in a market for semiconductor manufacturing apparatuses or for power devices, a thermally conductive sheet which withstands use at a high temperature of 200° C. or higher has been demanded, however, the thermally conductive sheet made of silicone rubber has currently been challenged by a problem also of such heat resistance.

In order to solve the problems above, Japanese Patent Laying-Open No. 2010-232535 has proposed use as a thermally conductive sheet (a heat-resistant heat radiation sheet), of a fluororubber sheet mainly composed of fluorine, which is obtained by causing reaction and curing of a mixture of liquid fluorinated polyether and a thermally conductive filler.

SUMMARY OF THE INVENTION

According to the fluororubber sheet, as compared with the silicone rubber sheet mainly composed of silicon, heat resistance can generally be improved. The conventional thermally conductive fluororubber sheet, however, has suffered the following problem.

Namely, in order to provide a thermally conductive sheet itself with high heat conduction performance, a relatively large amount of thermally conductive filler should be contained. When a large amount of thermally conductive filler is contained, however, correspondingly, hardness of the sheet becomes higher or tack (tackiness) of a sheet surface becomes lower. Such increase in hardness and lowering in surface tack both lower contact performance (adhesion) with a heat generator and a heat radiator arranged adjacent to the thermally conductive sheet, which becomes a factor for increase in thermal contact resistance. As thermal contact resistance is higher, performance of the thermally conductive sheet cannot sufficiently be exhibited in spite of high heat conduction performance of the thermally conductive sheet itself, and good efficiency in heat conduction from the heat generator to the heat radiator cannot be obtained.

Then, an object of the present invention is to provide a thermally conductive resin composition capable of forming a fluorine-based, highly heat-resistant thermally conductive sheet achieving both of good low hardness and high surface tack even in a case of filling with a thermally conductive filler at a high rate and hence exhibiting excellent heat conduction efficiency, and a thermally conductive sheet formed thereof.

The present inventor has conducted various studies in order to solve the problems above, found the following points, conducted further studies, and completed the present invention.

(1) When a fluorine-based compound pair forming a fluorine-based polymer (a rubber-like elastic body) exhibiting elastomer characteristics as a result of curing reaction (cross-linking) is used alone as a fluorine-based compound forming a binder for a fluorine-based thermally conductive sheet (for example, as in Examples in Japanese Patent Laying-Open No. 2010-232535 described above), hardness of a sheet becomes higher or tack of a sheet surface lowers in a case of filling with a thermally conductive filler at a high rate.

(2) On the other hand, when a fluorine-based compound pair forming a fluorine-based polymer (a gel-like elastic body) exhibiting gel characteristics as a result of curing reaction is used alone as the fluorine-based compound forming a binder for a fluorine-based thermally conductive sheet, sheet forming becomes difficult.

(3) In contrast, according to a thermally conductive resin composition obtained by using both of a fluorine-based compound pair forming a fluorine-based polymer (a rubber-like elastic body) exhibiting elastomer characteristics as a result of curing reaction [fluorine-based compounds (A1) and (B1) which will be described later] and a fluorine-based compound pair forming a fluorine-based polymer (a gel-like elastic body) exhibiting gel characteristics as a result of curing reaction [fluorine-based compounds (A2) and (B2) which will be described later] at an appropriate ratio as the fluorine-based compound forming a binder for a fluorine-based thermally conductive sheet and also by adjusting blending ratios (A1)/(B1) and (A2)/(B2) to appropriate prescribed ratios, a thermally conductive sheet having high heat resistance and having good low hardness and high surface tack even in a case of filling with a thermally conductive filler at a high rate can be obtained.

It is noted that the "elastomer characteristics" herein refer to Shore A hardness in a range from 20 to 40, which is measured in conformity with JIS K6253. In addition, the "gel characteristics" refer to a penetration number in a range from 60 to 80, which is measured in conformity with JIS K2207.

Namely, the present invention provides a thermally conductive resin composition, containing the following components:

(A1) a fluorine-based compound having a perfluoroalkyl ether structure in a main chain and one to two hydrosilyl group(s) at a molecule terminal, in which a content of molecules having two hydrosilyl groups is 60 to 100 mole %;

(B1) a fluorine-based compound having a perfluoroalkyl ether structure in a main chain and one to two alkenyl group(s) at a molecule terminal, in which a content of molecules having two alkenyl groups is 60 to 100 mole %;

(A2) a fluorine-based compound having a perfluoroalkyl ether structure in a main chain and one to two hydrosilyl group(s) at a molecule terminal, in which a content of molecules having two hydrosilyl groups is 0 to 40 mole %;

(B2) a fluorine-based compound having a perfluoroalkyl ether structure in a main chain and one to two alkenyl group(s) at a molecule terminal, in which a content of molecules having two alkenyl groups is 0 to 40 mole %; and (C) a thermally conductive filler, and satisfying, in connection with the content of the fluorine-based compounds (A1), (B1), (A2), and (B2), the following Equations [1] to [3]

$$[(A1)+(B1)]/[(A2)+(B2)]=20/80 \text{ to } 80/20 \quad [1]$$

$$(A1)/(B1)=20/80 \text{ to } 80/20 \quad [2]$$

$$(A2)/(B2)=20/80 \text{ to } 80/20 \quad [3].$$

Preferably, the thermally conductive resin composition according to the present invention further satisfies, in connection with the content of the fluorine-based compounds (A1), (B1), (A2), and (B2), the following Equations [4] and [5]

$$(A1)/(B1)=20/80 \text{ to } 40/60 \text{ or } 60/40 \text{ to } 80/20 \quad [4]$$

$$(A2)/(B2)=20/80 \text{ to } 40/60 \text{ or } 60/40 \text{ to } 80/20 \quad [5].$$

The fluorine-based compounds (A1), (B1), (A2), and (B2) can be a compound having a main chain structure expressed with the following Formula [6]

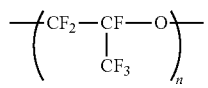

[6]

(where n is an integer from 1 to 10).

The alkenyl group which the fluorine-based compounds (B1) and (B2) have is, for example, a vinyl group.

The thermally conductive resin composition according to the present invention can contain 50 to 500 parts by weight of the thermally conductive filler (C) with respect to a total content of 100 parts by weight of the fluorine-based compounds (A1), (B1), (A2), and (B2). Preferably, the thermally conductive resin composition according to the present invention further contains (D) a platinum-group-based catalyst.

In addition, the present invention provides a thermally conductive sheet composed of a cured product of the thermally conductive resin composition according to the present invention above. The thermally conductive sheet according to the present invention typically exhibits ASKER C hardness not higher than 70 and surface tack not lower than 30 gf (which is measured in conformity with JIS Z3284).

According to the present invention, a thermally conductive sheet having high heat resistance and having both of good low hardness and high surface tack even in a case of filling with a thermally conductive filler at a high rate and hence exhibiting excellent heat conduction efficiency can be provided.

The thermally conductive sheet according to the present invention has high heat resistance and exhibits excellent heat conduction efficiency, and it can be used suitably as a thermally conductive sheet in a wide variety of fields including various apparatuses, electronic devices, and the like. When a thermally conductive sheet according to the present invention is applied, for example, to a semiconductor manufacturing apparatus, a semiconductor manufacturing process can be performed in a high-temperature environment. Therefore, higher integration of an LSI owing to a smaller line width of a circuit and hence a semiconductor device higher in performance can be realized.

A conventional Si-based LSI is approaching its theoretical performance limit, and demands for a next-generation power semiconductor including such a material as SiC, GaN, or diamond have been increasing. On the other hand, there have been few peripheral members adapting to operability at high temperature of a next-generation power semiconductor, and among others, there has been no thermally conductive sheet exhibiting sufficient heat resistance and heat conduction efficiency. The thermally conductive sheet according to the present invention can fulfill such demanded characteristics, and it can suitably be employed also for a power device such as a next-generation power semiconductor.

The foregoing and other objects, features, aspects and advantages of the present invention will become more apparent from the following detailed description of the present invention.

DESCRIPTION OF THE PREFERRED EMBODIMENTS

<Thermally Conductive Resin Composition>

A thermally conductive resin composition according to the present invention is suitably used for forming a thermally conductive sheet interposed between a heat generator and a heat radiator, for efficiently conducting heat from the heat generator to the heat radiator, and it contains the following components:

(A1) a fluorine-based compound having a perfluoroalkyl ether structure in a main chain and one to two hydrosilyl group(s) at a molecule terminal, in which a content of molecules having two hydrosilyl groups is 60 to 100 mole % [hereinafter also referred to as a "fluorine-based compound (A1)"];

(B1) a fluorine-based compound having a perfluoroalkyl ether structure in a main chain and one to two alkenyl group(s) at a molecule terminal, in which a content of molecules having two alkenyl groups is 60 to 100 mole % [hereinafter also referred to as a "fluorine-based compound (B1)"];

(A2) a fluorine-based compound having a perfluoroalkyl ether structure in a main chain and one to two hydrosilyl group(s) at a molecule terminal, in which a content of molecules having two hydrosilyl groups is 0 to 40 mole % [hereinafter also referred to as a "fluorine-based compound (A2)"];

(B2) a fluorine-based compound having a perfluoroalkyl ether structure in a main chain and one to two alkenyl group(s) at a molecule terminal, in which a content of molecules having two alkenyl groups is 0 to 40 mole % [hereinafter also referred to as a "fluorine-based compound (B2)"]; and (C) a thermally conductive filler.

As described above, the fluorine-based compounds (A1) and (B1) are a fluorine-based compound pair forming a fluorine-based polymer (a rubber-like elastic body) exhibiting elastomer characteristics as a result of curing (crosslinking) reaction, and the fluorine-based compounds (A2) and (B2) are a fluorine-based compound pair forming a fluorine-based polymer (a gel-like elastic body) exhibiting gel characteristics as a result of curing reaction. According to the present invention, these fluorine-based compounds (A1), (B1), (A2), and (B2) are used together and they are contained in a thermally conductive resin composition at a characteristic blending ratio, so that a thermally conductive sheet having high heat resistance and having both of good low hardness and high surface tack can be realized.

Here, attention should be paid to the fact that the present invention is not simply based on a concept of adjustment of characteristics of a thermally conductive sheet which is obtained by blending a cross-linked product (A1)–(B1) exhibiting elastomer characteristics and a cross-linked product (A2)–(B2) exhibiting gel characteristics. The thermally conductive resin composition according to the present invention does not contain as blended components, the cross-linked product (A1)–(B1) and the cross-linked product (A2)–(B2) prepared in advance but contains the fluorine-based compounds (A1), (B1), (A2), and (B2) in a state before cross-linking. Therefore, as a result of cross-linking of the four types of fluorine-based compounds above in various combination, a thermally conductive sheet formed of the thermally conductive resin composition contains as a binder, also various types of cross-linked products (more varieties of cross-linked products, taking into account also a polymer chain length and the like), other than the cross-linked products (A1)–(B1) and (A2)–(B2).

The present invention is characterized in that, while the present invention is premised on the concept that a fluorine-based compound pair forming a cross-linked product exhibiting elastomer characteristics if only such fluorine-based compounds are cross-linked with each other and a fluorine-based compound pair forming a cross-linked product exhibiting gel characteristics if only such fluorine-based compounds are cross-linked with each other are used together so that a thermally conductive sheet having both of an advantage of the elastomer characteristics and an advantage of the gel characteristics is obtained, a ratio of contents of the four types of fluorine-based compounds is appropriately controlled in order to realize a thermally conductive sheet having desired characteristics, taking into account that various cross-linked products are generated at the time of sheet forming as described above.

[1] Fluorine-Based Compound (A1)

The fluorine-based compound (A1) is a fluorine-based compound having a perfluoroalkyl ether structure in a main chain and one to two hydrosilyl group(s) (SiH group(s)) at a molecule terminal, in which a content of molecules having two hydrosilyl groups is 60 to 100 mole % and preferably 80 to 100 mole % (therefore, a content of molecules having one hydrosilyl group is 0 to 40 mole % and preferably 0 to 20 mole %) and being capable of addition reaction with an alkenyl group of the fluorine-based compound (B1) and the fluorine-based compound (B2).

A main chain structure of the fluorine-based compound (A1) can be constituted of a perfluoroxyalkylene unit and it is preferably a structure expressed with the following Formula [6]

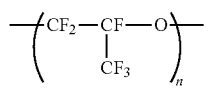

[6]

(where n is an integer from 1 to 10).

A representative example of a compound suitably used as the fluorine-based compound (A1) is a hydrosilyl-group-terminal fluorine-based compound expressed with the following Formula [7]

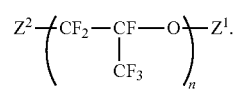

[7]

In Formula [7], n represents the meaning the same as above. $Z^1$ is a cross-linked portion containing a hydrosilyl group and represents $Si(H)(R^1)_2$. $Z^2$ represents $Si(H)(R^2)_2$ as in $Z^1$ in a molecule having two terminal hydrosilyl groups, and represents $Si(R^3)_3$ in a molecule having one terminal hydrosilyl group.

$R^1$, $R^2$, and $R^3$ above may be the same or different, and they are each independently a substituted or non-substituted monovalent hydrocarbon group, which is exemplified by: an alkyl group such as a methyl group, an ethyl group, a propyl group, a butyl group, a pentyl group, and a hexyl group; an aryl group such as a phenyl group, a tolyl group, and a xylyl group; a halogenated alkyl group such as a 3-chloropropyl group and 3,3,3-trifluoropropyl group; and the like. $R^1$, $R^2$, and $R^3$ are preferably an alkyl group having carbon atom number from 1 to 5.

The fluorine-based compound (A1) preferably has viscosity from 1.5 to 4.0 Pa·s, which is measured in conformity with JIS K7117-1.

A trade name "SIFEL 8370-A" or the like manufactured by Shin-Etsu Chemical Co., Ltd. can suitably be used as the fluorine-based compound (A1) expressed with Formula [7].

[2] Fluorine-Based Compound (B1)

The fluorine-based compound (B1) is a fluorine-based compound having a perfluoroalkyl ether structure in a main chain and one to two alkenyl group(s) at a molecule terminal, in which a content of molecules having two alkenyl groups is 60 to 100 mole % and preferably 80 to 100 mole % (therefore, a content of molecules having one alkenyl group is 0 to 40 mole % and preferably 0 to 20 mole %) and being capable of addition reaction with a hydrosilyl group of the fluorine-based compound (A1) and the fluorine-based compound (A2).

A main chain structure of the fluorine-based compound (B1) can be constituted of a perfluoroxyalkylene unit and it is preferably a structure expressed with Formula [6] above. In the fluorine-based compound (B1) as well, n in Formula [6] is an integer from 1 to 10. The number of ns in the fluorine-based compound (B1) may be the same as or different from the number of ns in the fluorine-based compound (A1).

A representative example of a compound suitably used as the fluorine-based compound (B1) is an alkenyl-group-terminal fluorine-based compound expressed with the following Formula [8]

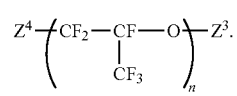

[8]

In Formula [8], n represents the meaning the same as above. $Z^3$ is a cross-linked portion containing an alkenyl group and represents Si (alkenyl group) $(R^4)_2$. $Z^4$ represents Si (alkenyl group) $(R^5)_2$ as in $Z^3$ in a molecule having two terminal alkenyl groups and represents $Si(R^6)_3$ in a molecule having one terminal alkenyl group.

$R^4$, $R^5$, and $R^6$ above may be the same or different, and they are each independently a substituted or non-substituted monovalent hydrocarbon group, which is as exemplified for $R^1$, $R^2$, and $R^3$ above. $R^4$, $R^5$, and $R^6$ are preferably an alkyl group having carbon atom number from 1 to 5.

The alkenyl group is normally exemplified by a group having carbon atom number from 2 to 8 and preferably approximately from 2 to 4, such as a vinyl group, a methylvinyl group, an allyl group, a propenyl group, a butenyl group, a pentenyl group, a hexenyl group, and a heptenyl group, and among others, the vinyl group is preferred.

The fluorine-based compound (B1) preferably has viscosity from 1.5 to 4.0 Pa·s, which is measured in conformity with JIS K7117-1.

A trade name "SIFEL 8370-B" or the like manufactured by Shin-Etsu Chemical Co., Ltd. can suitably be used as the fluorine-based compound (B1) expressed with Formula [8].

[3] Fluorine-Based Compound (A2)

The fluorine-based compound (A2) is a fluorine-based compound having a perfluoroalkyl ether structure in a main chain and one to two hydrosilyl group(s) (SiH group(s)) at a molecule terminal, in which a content of molecules having two hydrosilyl groups is 0 to 40 mole % and preferably 20 to 40 mole % (therefore, a content of molecules having one hydrosilyl group is 60 to 100 mole % and preferably 60 to 80 mole %) and being capable of addition reaction with an alkenyl group of the fluorine-based compound (B1) and the fluorine-based compound (B2).

A main chain structure of the fluorine-based compound (A2) can be constituted of a perfluoroxyalkylene unit and it is preferably a structure expressed with Formula [6] above. In the fluorine-based compound (A2) as well, n in Formula [6] is an integer from 1 to 10. The number of ns in the fluorine-based compound (A2) may be the same as or different from the number of ns in the fluorine-based compound(s) (A1) and/or (B1).

A representative example of a compound suitably used as the fluorine-based compound (A2) is a hydrosilyl-group-terminal fluorine-based compound expressed with the following Formula [9]

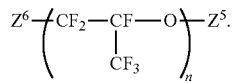

In Formula [9], n represents the meaning the same as above. $Z^5$ and $Z^6$ represent the meaning the same as $Z^1$ and $Z^2$ above, respectively.

The fluorine-based compound (A2) preferably has viscosity from 1.5 to 500 Pa·s, which is measured in conformity with JIS K7117-1.

A trade name "SIFEL 3405-A", "SIFEL 3505-A", or the like manufactured by Shin-Etsu Chemical Co., Ltd. can suitably be used as the fluorine-based compound (A2) expressed with Formula [9].

[4] Fluorine-Based Compound (B2)

The fluorine-based compound (B2) is a fluorine-based compound having a perfluoroalkyl ether structure in a main chain and one to two alkenyl group(s) at a molecule terminal, in which a content of molecules having two alkenyl groups is 0 to 40 mole % and preferably 20 to 40 mole % (therefore, a content of molecules having one alkenyl group is 60 to 100 mole % and preferably 60 to 80 mole %) and being capable of addition reaction with a hydrosilyl group of the fluorine-based compound (A1) and the fluorine-based compound (A2).

A main chain structure of the fluorine-based compound (B2) can be constituted of a perfluoroxyalkylene unit and it is preferably a structure expressed with Formula [6] above. In the fluorine-based compound (B2) as well, n in Formula [6] is an integer from 1 to 10. The number of ns in the fluorine-based compound (B2) may be the same as or different from the number of ns in the fluorine-based compound(s) (A1), (B1), and/or (A2).

A representative example of a compound suitably used as the fluorine-based compound (B2) is an alkenyl-group-terminal fluorine-based compound expressed with the following Formula [10]

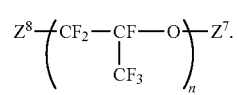

In Formula [10], n represents the meaning the same as above. $Z^7$ and $Z^8$ represent the meaning the same as $Z^3$ and $Z^4$ above, respectively. Similarly to the fluorine-based compound (B1), the alkenyl group can normally be a group having carbon atom number from 2 to 8 and preferably approximately from 2 to 4, such as a vinyl group, a methylvinyl group, an allyl group, a propenyl group, a butenyl group, a pentenyl group, a hexenyl group, and a heptenyl group, and among others, the vinyl group is preferred. The alkenyl group in the fluorine-based compound (B2) may the same as or different from the alkenyl group in the fluorine-based compound (B1).

The fluorine-based compound (B2) preferably has viscosity from 1.5 to 500 Pa·s, which is measured in conformity with JIS K7117-1.

A trade name "SIFEL 3405-B", "SIFEL 3505-B", or the like manufactured by Shin-Etsu Chemical Co., Ltd. can suitably be used as the fluorine-based compound (B2) expressed with Formula [10].

[5] Content of Fluorine-Based Compound

The thermally conductive resin composition according to the present invention satisfies, in connection with the content of the fluorine-based compounds (A1), (B1), (A2), and (B2), the following Equations [1] to [3]

$$[(A1)+(B1)]/[(A2)+(B2)]=20/80 \text{ to } 80/20 \quad [1]$$

$$(A1)/(B1)=20/80 \text{ to } 80/20 \quad [2]$$

$$(A2)/(B2)=20/80 \text{ to } 80/20 \quad [3].$$

By blending the fluorine-based compounds (A1), (B1), (A2), and (B2) at a ratio of contents satisfying Equations [1] to [3] above, a thermally conductive sheet having high heat resistance and having both of good low hardness and high surface tack even in a case of filling with the thermally conductive filler (C) at a high rate can be obtained.

In order to obtain better low hardness and high surface tack, a ratio of contents [(A1)+(B1)]/[(A2)+(B2)] is preferably not lower than 25/75 and more preferably not lower than 30/70 and preferably not higher than 75/25. The ratio of contents [(A1)+(B1)]/[(A2)+(B2)] can be, for example, not higher than 70/30, not higher than 60/40, or around 50/50. When the ratio of contents [(A1)+(B1)]/[(A2)+(B2)] is lower than 20/80, forming into a thermally conductive sheet tends to be difficult. On the other hand, when the ratio of contents [(A1)+(B1)]/[(A2)+(B2)] exceeds 80/20, hardness of the thermally conductive sheet may become high or surface tack may become low.

In addition to Equation [1] above, by setting the ratios of contents (A1)/(B1) and (A2)/(B2) each within a range from 20/80 to 80/20 (which satisfy Equations [2] and [3] above), both of good low hardness and high surface tack can be achieved. In order to obtain better low hardness, however, the ratios of contents (A1)/(B1) and (A2)/(B2) preferably satisfy the following Equations [4] and [5]

$$(A1)/(B1)=20/80 \text{ to } 40/60 \text{ or } 60/40 \text{ to } 80/20 \quad [4]$$

$$(A2)/(B2)=20/80 \text{ to } 40/60 \text{ or } 60/40 \text{ to } 80/20 \quad [5].$$

Namely, by excessively blending any one of the fluorine-based compounds (A1) and (B1) with respect to the other and excessively blending any one of the fluorine-based compounds (A2) and (B2) with respect to the other so as to satisfy Equations [4] and [5] above, the excessive fluorine-based compound effectively functions so that low hardness of the thermally conductive sheet can be improved. It is noted that, if the excess above is too much, that is, the ratio of contents (A1)/(B1) or (A2)/(B2) is lower than 20/80 or higher than 80/20, forming into a thermally conductive sheet tends to be difficult even though Equation [1] above is satisfied.

It is noted that, since the excessive fluorine-based compound above is analogous in molecular structure to a binder forming the thermally conductive sheet, it is unlikely to bleed (or extremely less likely to bleed) even during use at a high temperature. Bleeding of a component contained in a sheet during use at a high temperature becomes a factor for pollution of a system, however, the thermally conductive sheet according to the present invention is free from such a disadvantage and it is highly heat resistant also in this regard.

[6] Thermally Conductive Filler (C)

The thermally conductive filler (C) is not particularly restricted and a generally used filler can be employed, which is specifically exemplified by aluminum oxide ($Al_2O_3$), crystalline silicon oxide ($SiO_2$), magnesium oxide (MgO), beryllium oxide (BeO), zinc oxide (ZnO), silicon nitride ($Si_3N_4$), boron nitride (hexagonal BN or cubic BN), aluminum nitride (AlN), silicon carbide (SiC), carbon fibers, diamond, graphite, and the like.

The thermally conductive filler (C) can be in a shape of a grain, a flake, a needle, or the like, however, it is preferably in a shape of a grain because filling at higher density can be carried out. The granular thermally conductive filler (C) has an average particle size, for example, from 0.1 to 100 μm and preferably from 0.5 to 50 μm.

As the thermally conductive filler (C), one type of a thermally conductive filler may be used alone or two or more types of thermally conductive fillers may be used as being mixed. In addition, taking into account high-density filling capability or the like, two or more types of thermally conductive fillers different in average particle size can also be mixed for use.

In the thermally conductive resin composition according to the present invention, the content of the thermally conductive filler (C) is normally set to 50 to 500 parts by weight and preferably 100 to 400 parts by weight with respect to the total content of 100 parts by weight of the fluorine-based compounds (A1), (B1), (A2), and (B2). According to the present invention, even when the content of the thermally conductive filler (C) is increased, for example, to about 200 to 500 parts by weight, a thermally conductive sheet having good low hardness and high surface tack can be obtained. If the content of the thermally conductive filler (C) is not less than 50 parts by weight, preferably not less than 100 parts by weight, and further preferably not less than 250 parts by weight with respect to the total content of 100 parts by weight of the fluorine-based compounds, sufficient thermal conductivity performance of the thermally conductive sheet itself is likely to be obtained. Furthermore, if the content of the thermally conductive filler (C) is not more than 500 parts by weight and preferably not more than 400 parts by weight with respect to the total content of 100 parts by weight of the fluorine-based compounds, formability into a thermally conductive sheet can sufficiently be ensured and increase in hardness of a thermally conductive sheet due to extreme filling with a thermally conductive filler can be suppressed.

[7] Platinum-Group-Based Catalyst (D)

The thermally conductive resin composition according to the present invention can contain a platinum-group-based catalyst (D) catalyzing cross-linking reaction (hydrosilylation) between a hydrosilyl group and an alkenyl group of fluorine-based compounds, and it normally contains a platinum-group-based catalyst (D). For example, a platinum-based catalyst is preferably employed as the platinum-group-based catalyst (D). Examples of the platinum-based catalyst include: metal platinum; chloroplatinic acid; platinum chloride; platinum-olefin complex; platinum-alkenyl siloxane complex; platinum-carbonyl complex; platinum-phosphine complex; platinum-alcohol complex; a substance in which a carrier made of alumina, silica, carbon black, or the like carries platinum; and the like.

A rhodium-based compound, a ruthenium-based compound, an iridium-based compound, and a palladium-based compound are exemplified as the platinum-group-based catalysts other than the platinum-based catalyst.

A content of the platinum-group-based catalyst (D) is not particularly limited so long as the content is an effective amount necessary for promoting cross-linking and curing of the thermally conductive resin composition, and it can be 0 to 10 parts by weight with respect to the total content of 100 parts by weight of the fluorine-based compounds (A1), (B1), (A2), and (B2). Typically, the content is approximately from 0.1 to 1000 ppm with respect to the total content above.

[8] Other Blended Components

The thermally conductive resin composition according to the present invention can contain an anti-aging agent, an antioxidant, a flame retardant, a dispersant, a solvent, and the like, as necessary.

<Thermally Conductive Sheet>

The thermally conductive sheet according to the present invention can be obtained by sheet forming the thermally conductive resin composition above with a common method and cross-linking the thermally conductive resin composition through heating during forming. A forming method can be exemplified by press forming, injection molding, transfer molding, extrusion, and the like.

Though a thickness of the thermally conductive sheet is set as appropriate depending on applications or the like, the thickness is normally set to about 0.05 to 3 mm and preferably about 0.1 to 1 mm.

Since the thermally conductive sheet according to the present invention is formed of the thermally conductive resin composition according to the present invention above, it has high heat resistance and exhibits good low hardness and high surface tack. The thermally conductive sheet according to the present invention typically has ASKER C hardness not higher than 70, and it can have ASKER C hardness further not higher than 60 and further not higher than 50. In addition, typically, surface tack measured in conformity with JIS Z3284 is not lower than 30 gf, and it can further be not lower than 50 gf and further be not lower than 70 gf.

EXAMPLES

Though the present invention will be described hereinafter in further detail with reference to Examples, the present invention is not limited to these Examples. A test method in an evaluation test conducted for thermally conductive sheets obtained in Examples and Comparative Examples below is as follows.

(1) 10% Compressive Load

A columnar test piece having a diameter of 46.2 mm and a thickness (a height) of 1.0 mm was cut from the obtained thermally conductive sheet, and a load value (25° C.) at the time when load was applied thereto with the use of "AUTO GRAPH AG-500kND" manufactured by Shimadzu Corporation, to thereby compress the thickness by 10%, was measured. The "10% compressive load" refers to a physical property value serving as an indicator of hardness of the thermally conductive sheet, and hardness is lower as 10% compressive load is lower.

(2) Hardness

Hardness of the thermally conductive sheet at 25° C. was measured with an ASKER C durometer manufactured by ASKER. In order to evaluate heat resistance of the thermally conductive sheet, hardness before and after heat treatment (250° C., 5 hours) was measured and variation in hardness was checked.

(3) Surface Tack

Surface tack of the thermally conductive sheet was measured in conformity with JIS Z3284, specifically as follows. A thermally conductive sheet having a thickness of 0.75 mm was set on a stage of a tackiness tester ("Texture Analyzer TA-XT2" manufactured by Texture Technologies Corp.) and a ball probe made of stainless steel of ¼ inch φ was pressed against the thermally conductive sheet under measurement conditions below. Thereafter, a maximum resistance value at the time of pulling up by 2 mm was measured at 7 points within 10 minutes, and an average value thereof was calculated.

(Measurement Conditions)
Plate and probe temperature: 25° C.
Fall velocity: 0.2 mm/second
Entry depth: 0.1 mm
Load: 100 gf
Time of pressing: 10 seconds
Speed of pulling up: 0.2 mm/second
Distance of pulling up: 2 mm (4) Heat Resistance A test piece of 10 mm long, 10 mm wide, and 1.0 mm thick, which was cut from the thermally conductive sheet, was bonded onto a heat generating substrate (an amount of heat generation: 45 W). A substrate with cooling mechanism, which was made of the same material as the heat generating substrate above, was arranged on the test piece, and the substrates were pressure-bonded to each other under constant load of 98 kPa. A temperature sensor was attached to the substrates, and electric power was fed to the heat generating substrate while a temperature of the substrates was monitored. A temperature $T_1$ (° C.) of the heat generating substrate and a temperature $T_2$ (° C.) of the substrate with cooling mechanism after lapse of 5 minutes since start of electric power feed were measured, and heat resistance was calculated based on an equation below Heat Resistance (° $C/W$)=$(T_1-T_2)/Q$

[where Q represents an amount of heat generation (W) of the heat generating substrate]. In order to evaluate heat resistance of the thermally conductive sheet, heat resistance before and after heat treatment (250° C., 5 hours) was measured and variation in heat resistance was checked.

(5) Rate of Weight Reduction

Thermogravimetric (TG) analysis was conducted with the use of "TG-DTA 6200" manufactured by Seiko Instruments Inc., and a rate of weight reduction due to heat treatment at 200° C. for 5 hours and a rate of weight reduction (%) due to heat treatment at 250° C. for 5 hours were measured.

Examples 1 to 8, Comparative Examples 1 to 5

Each blended component shown in Tables 1 and 2 was mixed in an automatic mortar at a blending ratio shown in Tables 1 and 2 (a unit of a numeric value being part by weight), and the mixture was caused to pass between rollers to achieve high dispersion. The obtained, kneaded product was formed into a sheet through hot pressing (150° C., 10 minutes) by using a mold. A thermally conductive sheet was thus fabricated. Details of each blended component used in Examples and Comparative Examples are as follows.

[a] Fluorine-based compound (A1): a trade name "SIFEL 8370-A" manufactured by Shin-Etsu Chemical Co., Ltd. (a fluorine-based compound in which a content of molecules having 2 hydrosilyl groups is within a range from 60 to 100 mole %)

[b] Fluorine-based compound (B1): a trade name "SIFEL 8370-B" manufactured by Shin-Etsu Chemical Co., Ltd. (a fluorine-based compound in which a content of molecules having 2 alkenyl groups is within a range from 60 to 100 mole %)

[c] Fluorine-based compound (A2): a trade name "SIFEL 3405-A" manufactured by Shin-Etsu Chemical Co., Ltd. (a fluorine-based compound in which a content of molecules having 2 hydrosilyl groups is within a range from 0 to 40 mole %)

[d] Fluorine-based compound (B2): a trade name "SIFEL 3405-B" manufactured by Shin-Etsu Chemical Co., Ltd. (a fluorine-based compound in which a content of molecules having 2 alkenyl groups is within a range from 0 to 40 mole %)

[e] Silicon-based compound: "Sarcon" manufactured by Fuji Polymer Industries Co., Ltd.

[f] Aluminum oxide A: "DAM-45" manufactured by Denki Kagaku Kogyo Kabushiki Kaisha (an average particle size of 40 μm)

[g] Aluminum oxide B: "DAM-05A" manufactured by Denki Kagaku Kogyo Kabushiki Kaisha (an average particle size of 0.5 μm)

[h] Platinum catalyst: "TEC10E50E" manufactured by Tanaka Kikinzoku Kogyo K.K. (a carried amount of 50 weight %)

TABLE 1

|  |  | Example 1 | Example 2 | Example 3 | Example 4 | Example 5 | Example 6 | Example 7 | Example 8 |
|---|---|---|---|---|---|---|---|---|---|
| Binder | Fluorine-Based Compound (A1) | 30 | 25 | 35 | 15 | 45 | 15 | 42 | 18 |
|  | Fluorine-Based Compound (B1) | 20 | 25 | 15 | 35 | 30 | 10 | 28 | 12 |
|  | Fluorine-Based Compound (A2) | 30 | 25 | 35 | 15 | 15 | 45 | 18 | 42 |
|  | Fluorine-Based Compound (B2) | 20 | 25 | 15 | 35 | 10 | 30 | 12 | 28 |
|  | Silicon-Based Compound | — | — | — | — | — | — | — | — |
|  | Total | 100 | 100 | 100 | 100 | 100 | 100 | 100 | 100 |
|  | [(A1) + (B1)]/[(A2) + (B2)] | 50/50 | 50/50 | 50/50 | 50/50 | 75/25 | 25/75 | 70/30 | 30/70 |
|  | (A1)/(B1) | 60/40 | 50/50 | 70/30 | 30/70 | 60/40 | 60/40 | 60/40 | 60/40 |
|  | (A2)/(B2) | 60/40 | 50/50 | 70/30 | 30/70 | 60/40 | 60/40 | 60/40 | 60/40 |
| Thermally Conductive Filler (C) | Aluminum Oxide A | 270 | 270 | 270 | 270 | 270 | 270 | 270 | 270 |
|  | Aluminum Oxide B | 30 | 30 | 30 | 30 | 30 | 30 | 30 | 30 |
| Platinum-Group-Based Catalyst (D) | Platinum Catalyst | 0.5 | 0.5 | 0.5 | 0.5 | 0.5 | 0.5 | 0.5 | 0.5 |
| 10% Compressive Load (N/cm$^2$) |  | 37 | 87 | 45 | 60 | 75 | 40 | 80 | 38 |
| ASKER C Hardness | Before Heat Treatment | 51 | 68 | 48 | 52 | 61 | 50 | 63 | 47 |
|  | After Heat Treatment | 53 | 70 | 48 | 54 | 65 | 53 | 63 | 52 |
| Surface Tack (gf) |  | 72 | 52 | 68 | 65 | 34 | 80 | 32 | 81 |
| Heat Resistance (° C./W) | Before Heat Treatment | 3.5 | 4.5 | 3.7 | 4.0 | 6.1 | 3.1 | 6.3 | 3.0 |
|  | After Heat Treatment | 3.5 | 4.6 | 3.9 | 4.1 | 6.2 | 3.5 | 6.3 | 3.5 |
| Rate of Weight Reduction (%) | 200° C., 5 Hours | 0.9 | 0.7 | 1.2 | 1.4 | 0.8 | 1.2 | 0.7 | 1.4 |
|  | 250° C., 5 Hours | 1.7 | 1.4 | 2.0 | 2.1 | 1.6 | 1.5 | 1.5 | 2.1 |

TABLE 2

|  |  | Comparative Example 1 | Comparative Example 2 | Comparative Example 3 | Comparative Example 4 | Comparative Example 5 |
|---|---|---|---|---|---|---|
| Binder | Fluorine-Based Compound (A1) | 45 | 5 | 45 | 5 | — |
|  | Fluorine-Based Compound (B1) | 5 | 45 | 45 | 5 | — |
|  | Fluorine-Based Compound (A2) | 45 | 5 | 5 | 45 | — |
|  | Fluorine-Based Compound (B2) | 5 | 45 | 5 | 45 | — |
|  | Silicon-Based Compound | — | — | — | — | 100 |
|  | Total | 100 | 100 | 100 | 100 | 100 |
|  | [(A1) + (B1)]/[(A2) + (B2)] | 50/50 | 50/50 | 90/10 | 10/90 | — |
|  | (A1)/(B1) | 90/10 | 10/90 | 50/50 | 50/50 | — |
|  | (A2)/(B2) | 90/10 | 10/90 | 50/50 | 50/50 | — |
| Thermally Conductive Filler (C) | Aluminum Oxide A | 400 | 270 | 270 | 270 | 425 |
|  | Aluminum Oxide B | 50 | 30 | 30 | 30 | 75 |
| Platinum-Group-Based Catalyst (D) | Platinum Catalyst | 0.5 | 0.5 | 0.5 | 0.5 | 0.5 |
| 10% Compressive Load (N/cm$^2$) |  | Sheet Forming Not Achieved | Sheet Forming Not Achieved | 184 | Sheet Forming Not Achieved | 40 |
| ASKER C Hardness | Before Heat Treatment |  |  | 96 |  | 40 |
|  | After Heat Treatment |  |  | 99 |  | 54 |
| Surface Tack (gf) |  |  |  | 7 |  | 27 |
| Heat Resistance (° C./W) | Before Heat Treatment |  |  | 5.7 |  | 1.6 |
|  | After Heat Treatment |  |  | 5.9 |  | 3.1 |
| Rate of Weight Reduction (%) | 200° C., 5 Hours |  |  | 1.0 |  | 0.7 |
|  | 250° C., 5 Hours |  |  | 1.2 |  | 1.4 |

As shown in Table 1, it can be seen that the thermally conductive sheets in Examples 1 to 8 were low in rate of change in hardness and heat resistance before and after heat treatment and also in rate of weight reduction, and therefore they had high heat resistance. In addition, the thermally conductive sheets in Examples 1 to 8 have good low hardness (ASKER C hardness not higher than 70) and high surface tack (not lower than 30 gf). Moreover, bleeding was not observed during heat treatment (250° C., 5 hours) of the thermally conductive sheets in Examples 1 to 8.

In contrast, in Comparative Examples 1, 2, and 4, because (A1)/(B1) and (A2)/(B2) were excessively high or excessively low or [(A1)+(B1)]/[(A2)+(B2)] was excessively low, sheet forming could not be achieved. Furthermore, in the thermally conductive sheet in Comparative Example 3, since [(A1)+(B1)]/[(A2)+(B2)] was excessively high, hardness was high and surface tack was also low.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A thermally conductive sheet composed of a cured product of a thermally conductive resin composition, said thermally conductive resin composition, comprising:

A1) a fluorine-based compound having a perfluoroalkyl ether structure in a main chain and one to two hydrosilyl group(s) at molecule terminal end of the main chain, in which a content of molecules having two hydrosilyl groups is 60 to 100 mole %;

(B1) a fluorine-based compound having a perfluoroalkyl ether structure in a main chain and one to two alkenyl group(s) at molecule terminal of the main chain, in which a content of molecules having two alkenyl groups is 60 to 100 mole %;

(A2) a fluorine-based compound having a perfluoroalkyl ether structure in a main chain and one to two hydrosilyl group(s) at molecule terminal end of the main chain, in which a content of molecules having two hydrosilyl groups is 0 to 40 mole % while a total content of molecules having one to two hydrosilyl group(s) is not 0;

(B2) a fluorine-based compound having a perfluoroalkyl ether structure in a main chain and one to two alkenyl group(s) at molecule terminal end of the main chain, in which a content of molecules having two alkenyl groups is 0 to 40 mole % while a total content of molecules having one to two alkenyl group(s) is not 0; and (C) a thermally conductive filler, said thermally conductive resin composition satisfying, in connection with the content of said fluorine-based compounds (A1), (B1), (A2), and (B2), following Equations [1] to [3]

$$[(A1)+(B1)]/[(A2)+(B2)] = 20/80 \text{ to } 80/20 \text{ by weight} \quad [1]$$

$$(A1)/(B1) = 20/80 \text{ to } 80/20 \text{ by weight} \quad [2]$$

$$(A2)/(B2) = 20/80 \text{ to } 80/20 \text{ by weight} \quad [3]$$

wherein the ratio for equation (1) is based on a total weight of A1, B1, A2, and B2; the ratio for equation (2) is based on a total weight of A1 and B1; and the ratio for equation (3) is based on a total weight of A2 and B2;

said fluorine-based compounds (A1), (B1), (A2), and (B2) have a perfluoroalkyl ether structure in a main chain, wherein said perfluoroalkyl ether structure is expressed with following Formula [6]

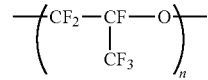

[6]

(where n is an integer from 1 to 10).

2. The thermally conductive sheet according to claim 1, satisfying, in connection with the content of said fluorine-based compounds (A1), (B1), (A2), and (B2), following Equations [4] and [5]

$$(A1)/(B1) = 20/80 \text{ to } 40/60 \text{ or } 60/40 \text{ to } 80/20 \text{ by weight} \quad [4]$$

$$(A2)/(B2) = 20/80 \text{ to } 40/60 \text{ or } 60/40 \text{ to } 80/20 \text{ by weight} \quad [5].$$

3. The thermally conductive sheet according to claim 1, wherein the alkenyl group which said fluorine-based compounds (B1) and (B2) have is a vinyl group.

4. The thermally conductive sheet according to claim 1, wherein said thermally conductive resin composition comprises 50 to 500 parts by weight of said thermally conductive filler (C) with respect to a total content of 100 parts by weight of said fluorine-based compounds (A1), (B1), (A2), and (B2).

5. The thermally conductive sheet according to claim 1, wherein said thermally conductive resin composition further comprises (D) a platinum-group-based catalyst.

6. The thermally conductive sheet according to claim 1, where said thermally conductive sheet has an ASKER C hardness not higher than 70 and a surface tack not lower than 30 gf, which is measured in conformity with JIS Z3284.

* * * * *